United States Patent [19]
Tan

[11] Patent Number: 5,818,374
[45] Date of Patent: *Oct. 6, 1998

[54] SWITCHED CURRENT DELTA-SIGMA MODULATOR

[75] Inventor: Nianxiong Tan, Sollentuna, Sweden

[73] Assignee: Telefonaktiebolaget LM Ericsson, Stockholm, Sweden

[*] Notice: This patent issued on a continued prosecution application filed under 37 CFR 1.53(d), and is subject to the twenty year patent term provisions of 35 U.S.C. 154(a)(2).

[21] Appl. No.: 646,970

[22] Filed: May 8, 1996

[51] Int. Cl.$^6$ .................................................. H03M 3/00
[52] U.S. Cl. .............................................................. 341/143
[58] Field of Search ............................................... 341/143

[56] References Cited

U.S. PATENT DOCUMENTS

| | | | |
|---|---|---|---|
| 5,061,928 | 10/1991 | Karema et al. | 341/143 |
| 5,065,157 | 11/1991 | Ribner et al. | 341/143 |
| 5,187,482 | 2/1993 | Tiemann et al. | 341/143 |
| 5,414,424 | 5/1995 | Cabler | 341/143 |
| 5,420,892 | 5/1995 | Okamoto | 341/143 |

FOREIGN PATENT DOCUMENTS

| | | |
|---|---|---|
| 0001723 | 8/1989 | Japan . |
| 0212923 | 1/1991 | Japan . |

OTHER PUBLICATIONS

Tan et al. *A Fully Differential Switched Current Delta–Sigma Modulator Using a Single 3.3 V Power Supply Voltage.*, Converters, Conference paper at International Symposium on Circuits and Systems, May 30–Jun. 2, 1994.

Tan *A low–Voltage Switched–Current Delta–Sigma Modulator*, IEEE Journal of Solid State Circuits, vol. 30, No. 5, May 1995, pp. 599–603.

Tan, *On switched–current Δ–Σ A/D Converters*, Conference paper at International Symposium on Circuits and Systems, Apr. 28–May 3, Seattle, Washington.

Tan *Low–Voltage Low–Power Switched–Current Circuits and Systems*, Conference Paper European Design and Test Conference, Paris France Mar. 6–9, 1995.

"Fourth–order SI delta–sigma modulators for high–frequency applications", N. Tan, *Electronics Letters,* 2nd, vol. 31, No. 5, Mar. 1995.

"A Low–Voltage Swithched–Current Delta–Sigma Modulator", Nianxiong Tan and Sven Eriksson, *IEEE Journal of Solid–State Circuits,* vol. 30, No. 5, May 1995.

"Oversampling A/D Converters and Current–Mode Techniques", Nianxiong Tan, Linköping Studies in Science and Technology Dissertations No. 360, Department of Electrical Engineering.

*Primary Examiner*—Howard L. Williams
*Attorney, Agent, or Firm*—Burns, Doane, Swecker & Mathis, L.L.P.

[57] ABSTRACT

A noise-limiting, switched current delta-sigma modulator for use in, for example, an oversampling analog-to-digital converter. The modulator includes a first integrator having a relatively large bias current and one or more second integrators having relatively small bias currents. The modulator according to the present invention reduces power consumption and chip area.

18 Claims, 1 Drawing Sheet

SWITCHED CURRENT DELTA-SIGMA MODULATOR

FIELD OF THE INVENTION

The present invention generally relates to switched-current delta-sigma modulators, such as are used in oversampling analog-to-digital (A/D) converters. More specifically, the present invention provides a delta-sigma modulator which offers reduced power consumption and chip area.

BACKGROUND OF THE INVENTION

Traditionally, analog circuits have been used extensively in signal processing applications. Recently, however, digital signal processing circuits have been used in conjunction with analog processing circuits. It is relatively inexpensive to fabricate high density digital circuits, but is relatively expensive to integrate analog circuit components. Accordingly, in many signal processing applications, the source and destination circuits are analog circuits, while much of the signal processing is performed by digital circuits. Therefore, analog-to-digital (A/D) and digital-to-analog (D/A) converters are important signal processing components.

Traditional Nyquist A/D converters typically require high accuracy analog components and high performance anti-aliasing filters. Because of this requirement, oversampling A/D converters are often preferred because they do not require high accuracy analog components or high performance anti-aliasing filters. Oversampling A/D converters instead require high performance digital circuits, which are relatively inexpensive. An oversampling A/D converter usually consists of a delta-sigma modulator (analog circuits) and a digital decimation filter. To realize delta-sigma modulators, the switched-capacitor (SC) technique is typically employed. However, the SC technique requires linear capacitors that are not practical in a digital CMOS baseline fabrication process. To create linear capacitors, extra process steps are needed in the digital CMOS baseline fabrication process, increasing the cost. To realize delta-sigma modulators in a pure digital CMOS process, a switched-current (SI) technique is desirable in which currents are signal carriers. An extensive treatment of SI delta-sigma modulators is provided in "Oversampling A/D Converters and Current-Mode Techniques" by Nianxiong Tan (1994), and related publications. Circuit noise (e.g., thermal noise) limits dynamic range more than the quantization noise. In SI circuits, the dynamic range can be increased without reducing speed by increasing the bias current, thereby increasing the highest input current. The above publication reveals that for every doubling of bias currents, the dynamic range of any SI circuit can be increased by 3 dB without speed penalty. For high-order delta-sigma modulators, the thermal noise rather than the quantization noise limits the performance. The dynamic range of modulators is limited by the dynamic range of the constituent SI circuits. However, increasing the bias currents for all the SI circuits in a delta-sigma modulator to achieve high dynamic range is very power consuming, and results in inefficient use of chip area.

SUMMARY OF THE INVENTION

The present invention overcomes the above-described problems, and provides other advantages, by providing for a switched-current (SI) delta-sigma modulator for use in an oversampling analog-to-digital (A/D) converter. The invention includes, in two exemplary embodiments, a first integrator having a relatively large bias current, and therefore a relatively large dynamic range. The exemplary modulators further include one or more second integrators, having a relatively small bias current. The modulators according to the present invention offer reduced power consumption and chip area. The power consumption and chip area savings increase as the number of integrators (i.e., the order of the modulator) increases.

BRIEF DESCRIPTION OF THE DRAWINGS

A more complete understanding of the present invention can be obtained by reading the following Detailed Description of the Preferred Embodiments in conjunction with the accompanying drawings, in which like reference indicia indicate like elements, and in which.

DETAILED DESCRIPTION OF THE PREFERRED EMBODIMENTS

Figure 1:
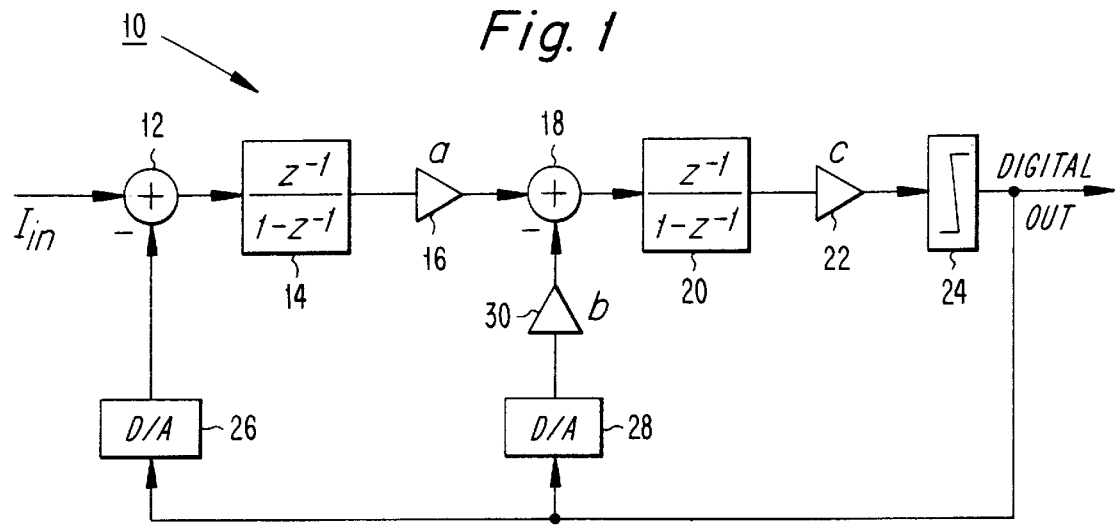
FIG. 1 is a block diagram of a noise-limiting switched current delta-sigma modulator according to an exemplary embodiment of the present invention.

A noise-limiting switched current delta-sigma modulator according to an exemplary embodiment of the present invention is shown in FIG. 1. The modulator 10 shown is a second order modulator, and includes first and second combiners 12 and 18, first and second integrators 14 and 20, first and third amplifiers 16 and 22, and a 1-bit current quantizer 24. The modulator further includes first and second digital-to-analog converters 26 and 28, and a second amplifier 30.

The first combiner 12 receives an input current signal and combines the input current signal with the signal output by D/A converter 26, which is an analog version of the digital output signal generated by current quantizer 24. Specifically, the first combiner 12 subtracts the analog version of the digital output signal from the input current signal to produce a first combined signal. First integrator 14 integrates the first combined signal and supplies a first integrated signal to first amplifier 16, which amplifies the first integrated signal by a first scaling factor a. First integrator 14 is biased with a first bias current, which is relatively large compared to the bias current of the second integrator. According to one exemplary embodiment, the first bias current is approximately four times larger than the bias current of the second integrator. However, this ratio is dependent upon the selection of the scaling factors for the first and second amplifiers 16 and 30, as will be discussed in more detail below.

Second combiner 18 combines the first amplified signal output by first amplifier 16 with the signal output by second amplifier 30, which is an analog version of the digital output signal generated by current quantizer 24 amplified by a second scaling factor b in second amplifier 30. Specifically, second combiner 18 subtracts the amplified analog version of the digital output signal from the first amplified signal to generate a second combined signal. Second integrator 20 integrates the second combined signal and supplies a second integrated signal to third amplifier 22, which amplifies the second integrated signal by a third scaling factor c. Second integrator 20 is biased with a second bias current, which is smaller than the first bias current, as described above. Finally, current quantizer 24 quantizes the second amplified signal to generate the digital output signal, which is fed back to first and second combiners 12 and 18 via D/A converters 26 and 28, respectively. Preferably, current quantizer 24 is a single-bit quantizer and first and second D/A converters 26 and 28 are single-bit converters.

First and second integrators 14 and 20 can have transfer functions of approximately $z^{-1}/(1-z^{-1})$, or another suitable transfer function.

In a delta-sigma modulator, only the noise at the first integrator input limits the dynamic range, since noise introduced at other nodes is suppressed at low frequencies by the noise reduction feedback loop formed by D/A converters 26 and 28, and second amplifier 30 in the modulator. The third scaling factor c introduced immediately preceding the single bit current quantizer 24 by third amplifier 22 can be any arbitrary positive factor without having any influence on the quantization, since the quantizer senses only current direction. It will be appreciated that the scaling factor can be distributed within the modulator. When the input current is scaled down, the following modulator stage can have a smaller bias current.

Therefore, in a noise-limiting SI delta-sigma modulator, a large bias current in the first integrator provides a large dynamic range; in the following integrators smaller bias currents can be used if the signal is properly scaled by suitable connected scaling elements such as amplifiers 22 and 30.

Figure 2:
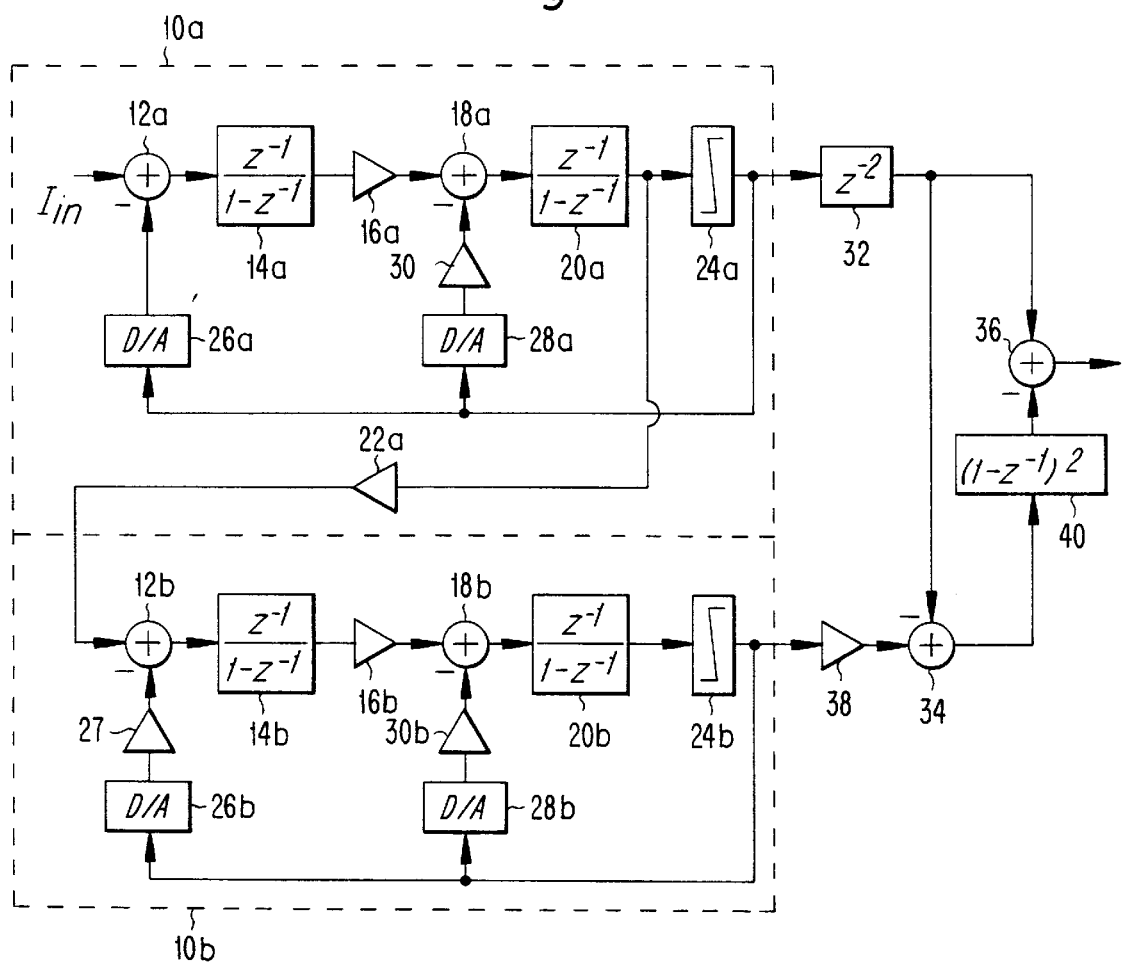
FIG. 2 is a block diagram of a fourth-order delta-sigma modulator according to an exemplary embodiment of the present invention.

In traditional switched-capacitor (SC) realizations, the scaling factors a, b, and c are chosen such that the signal swing in both integrators are equal. In conventional switched-current (SI) realizations, the same guideline is used, though scalings in SC and SI differ. In a noise-limiting modulator, a large bias current in both integrators improves dynamic range (for example, 3 dB increase in range is possible for each doubling of the bias currents). In a delta-sigma modulator (e.g., as shown in FIGS. 1 and 2), as long as the first integrator has a sufficient dynamic range, the modulator can deliver a high dynamic range regardless of the second integrator bias current, since noise present in the second integrator experiences noise shaping due to the feedback loop. Therefore, current can be aggressively scaled before being fed to the second integrator. Due to second scaling factor b, the signal swing in the second integrator is much smaller than in the first integrator and therefore a smaller bias current is sufficient. By scaling the signal swings within each integrator, power and chip area can be saved.

The third scaling factor c does not influence the signal transfer and noise shaping functions. The relationship between a and b is determined by the noise shaping function (b=2a), but the values can be chosen to scale the signal (current) swing in the second integrator. If a=0.5 and b=1, the signal swings in both integrator are the same (this is the general practice for SI delta-sigma modulators). If a=⅛ and b=¼, the signal swing in the second integrator is four times smaller than in the first integrator. Obviously, the bias current in the second integrator can be four times smaller.

The principle described above is general and can be applied to any SI delta-sigma modulator. The higher order the modulator is, the more efficient the method is. In order to achieve a high dynamic range, the first integrator occupies the most chip area and dissipates the most power; the remaining integrators can be designed with very small chip area and power consumption. The use of a large bias current in the first integrator improves the dynamic range since the modulator's dynamic range is limited by the dynamic range in the first integrator. The influence of the quantization noise can usually be made very small in high-order modulators. To illustrate the point, an example of a fourth-order delta-sigma modulator is shown in FIG. 2.

The fourth-order delta-sigma modulator of FIG. 2 includes two second-order delta-sigma modulators 10a and 10b, each of which is substantially similar to the second-order delta-sigma modulator 10 shown in FIG. 1. In the embodiment shown in FIG. 2, the second modulator 10b includes an additional amplifier 27b between first D/A converter 26b and first combiner 12b. The second integrated signal generated by second integrator 20a of first modulator 10a is amplified by the second scaling factor by third amplifier 22a, and this amplified connecting signal is supplied as the analog input signal to the first combiner 12b of second modulator 10b. The connecting scaling factor, according to an exemplary embodiment, is approximately ½.

The first digital output signal from quantizer 24a of first modulator 10a is supplied to an output delay element 32, and the delay element output signal is supplied to first and second output combiners 34 and 36. The second digital output signal from quantizer 24b of second modulator 10b is amplified by an output scaling factor in output amplifier 38. The amplified second digital output signal is supplied to first output combiner 34, which subtracts the delay element output signal from the amplified second digital output signal to generate a first combined output signal. The first combined output signal from first combiner 34 is differentiated in an output differentiator 40, and the differentiated signal is supplied to second output combiner 36. Second output combiner 36 subtracts the signal output by output differentiator 40 from the delay element output signal from delay element 32 to generate a digital output signal. It will be appreciated that the principles of the present invention can be implemented in this or any other suitable fourth-order delta-sigma modulator arrangement.

According to an exemplary embodiment, the transfer functions of the integrators 14a, 14b, 20a, and 20b can be approximately $z^{-1}/(1-z^{-1})$, the transfer function of the output delay element 32 can be approximately $z^{-2}$, and the transfer function of the output differentiator 40 can be approximately $(1-z^{-1})^2$. Further, according to the same embodiment, the scaling factor of first amplifier 16a is approximately ⅛, the scaling factor of amplifiers 27, 30a, and 30b is approximately ¼, the scaling factor of amplifiers 22a and 16b is approximately ½, and the scaling factor of output amplifier 38 is approximately 4.

In conventional modulators, all the integrators typically have the same signal swing. In the modulator of the present invention, the signal swing in the first integrator is e.g., four times larger than that in all the other integrators. The scaling does not change the signal transfer or noise shaping function. However, the bias currents in the integrators except for the first one can be smaller and power consumption and chip area can be reduced.

As described above, the present invention provides improved SI delta-sigma modulators, by fully utilizing the facts that signal swings in SI circuits are independent of the supply voltage and that by reducing the signal swing, the power consumption and chip area can be reduced. To achieve a high dynamic range in SI delta-sigma modulators, a large signal swing in the first integrator provides a high dynamic range. The dynamic range in the first integrator is the fundamental limitation of the dynamic range of the SI delta-sigma modulator, regardless of the circuit configurations and system structures. The modulators according to the invention maintain a large signal swing in the first integrator and reduce signal swing in all other integrators through scaling. By doing so, a modulator having high dynamic range with low power and small chip area can be achieved.

While the foregoing description has included many details and specificities, it is to be understood that these are for illustrative purposes only, and are not to be construed as limitation of the invention. Numerous modifications to the above-described embodiments will be readily apparent to those of ordinary skill in the art which are encompassed by the spirit and scope of the present invention, as defined by the following claims and their legal equivalents.

What is claimed is:

1. A delta-sigma modulator, comprising:
   a first combiner for generating a first combined signal by combining an analog input current signal with an analog version of a digital output signal;
   a first integrator for integrating the first combined signal, the first integrator having a first bias current and a first signal swing;
   a first amplifier for amplifying the first integrated signal by a first scaling factor;
   a second amplifier for amplifying the analog version of the digital output signal by a second scaling factor greater than the first scaling factor;
   a second combiner for generating a second combined signal by combining the first amplified signal with the second amplified signal;
   a second integrator for integrating the second combined signal, the second integrator having a second bias current smaller than the first bias current and a second signal swing which is less than about one-half the first signal swing;
   a third amplifier for amplifying the second integrated signal by a third scaling factor greater than the first scaling factor; and
   a current quantizer for quantizing the third amplified signal to generate the digital output signal.

2. The modulator of claim 1, wherein the first and second integrators have a transfer function of approximately $z^{-1}/(1-z^{-1})$.

3. The modulator of claim 1, wherein the third scaling factor is approximately twice the first scaling factor.

4. The modulator of claim 3, wherein the third scaling factor is approximately ¼ and the first scaling factor is approximately ⅛.

5. The modulator of claim 1, further comprising a digital filter for filtering the digital output signal.

6. The modulator of claim 1, wherein the current quantizer is a single bit quantizer.

7. The modulator of claim 1, further comprising at least one digital-to-analog converter for generating the analog version of the digital output signal.

8. The modulator of claim 7, wherein the at least one digital-to-analog converter is a single bit digital-to-analog converter.

9. The modulator of claim 1, wherein the first combiner subtracts the analog version of the digital output signal from the analog input signal and the second combiner subtracts the amplified analog version of the digital output signal from the first amplified signal.

10. An analog to digital converter for converting an analog input signal into a digital output signal, comprising:
    two or more delta-sigma modulators, each delta-sigma modulator including a first integrator biased with a first bias current and one or more second integrators biased with one or more second bias currents, each second bias current being less than about one-half the first bias current, wherein a first delta-sigma modulator includes a first amplifier for scaling a first integrator output signal by a first scaling factor, and the converter further includes a plurality of additional amplifiers for scaling signals by at least approximately twice the first scaling factor;
    a current quantizer for quantizing an integrated analog signal output by one of the one or more second integrators to generate the digital output signal; and
    a noise reduction feedback loop for combining the digital output signal with the analog input signal and with an output signal from the first integrator.

11. The analog to digital converter of claim 10, further comprising a digital decimation filter.

12. The analog to digital converter of claim 10, wherein the first bias current is approximately four times as large as the one or more second bias currents.

13. The analog to digital converter of claim 10, wherein at least one of the additional amplifiers scales an output signal by a scaling factor which is approximately 32 times the first scaling factor.

14. The analog to digital converter of claim 13, wherein the noise reduction feedback loop includes at least one digital to analog converter for generating an analog version of the digital output signal and at least one feedback amplifier for scaling the analog version of the digital output signal by a feedback scaling factor.

15. The analog to digital converter of claim 14, wherein the feedback scaling factor is approximately twice the first scaling factor.

16. The analog to digital converter of claim 10, wherein the first integrator and the one or more second integrators have a transfer function of approximately $z^{-1}/(1-z^{-1})$.

17. The analog to digital converter of claim 10, wherein the first integrator is larger than the one or more second integrators.

18. A method for modulating/converting an analog input signal to a digital output signal, comprising the steps of:
    combining the analog input signal and an analog version of the digital output signal to generate a first combined signal;
    integrating the first combined signal using an integrator having a first bias current;
    amplifying the first integrated signal by a first scaling factor;
    combining the first amplified signal with a second amplified signal generated by amplifying the analog version of the digital output signal by a second scaling factor to generate a second combined signal;
    integrating the second combined signal using an integrator having second bias current smaller than the first bias current;
    amplifying the second integrated signal by a second scaling factor greater than the first scaling factor; and
    quantizing the amplified second integrated signal to generate the digital output signal.

* * * * *

UNITED STATES PATENT AND TRADEMARK OFFICE
CERTIFICATE OF CORRECTION

PATENT NO. : 5,818,374
DATED : October 6, 1998
INVENTOR(S) : Nianxiong TAN

It is certified that error appears in the above-indentified patent and that said Letters Patent is hereby corrected as shown below:

In the drawings

Fig. 2, reference numeral "30" should read --30a--; and

Col. 4, line 8, "27*b*" should read --27--.

Signed and Sealed this

Twenty-seventh Day of July, 1999

Attest:

Q. TODD DICKINSON

*Attesting Officer*  *Acting Commissioner of Patents and Trademarks*